(12) United States Patent
Ryan

(10) Patent No.: US 7,583,108 B2
(45) Date of Patent: Sep. 1, 2009

(54) CURRENT COMPARATOR USING WIDE SWING CURRENT MIRRORS

(75) Inventor: Kevin Ryan, Colorado Springs, CO (US)

(73) Assignee: Aeroflex Colorado Springs Inc., Colorado Springs, CO (US)

( * ) Notice: Subject to any disclaimer, the term of this patent is extended or adjusted under 35 U.S.C. 154(b) by 0 days.

(21) Appl. No.: 11/384,013

(22) Filed: Mar. 17, 2006

(65) Prior Publication Data

US 2007/0216447 A1 Sep. 20, 2007

(51) Int. Cl.
*H03K 5/153* (2006.01)
(52) U.S. Cl. ........................................ 327/77
(58) Field of Classification Search .................... 327/77
See application file for complete search history.

(56) References Cited

U.S. PATENT DOCUMENTS

| | | | |
|---|---|---|---|
| 4,814,635 A | | 3/1989 | Allen et al. |
| 4,918,336 A | | 4/1990 | Graham et al. |
| 5,034,635 A | | 7/1991 | Ten Eyck |
| 5,287,536 A | | 2/1994 | Schreck et al. |
| 5,367,491 A | | 11/1994 | Han et al. |
| 5,446,397 A | * | 8/1995 | Yotsuyanagi ................. 327/66 |
| 5,488,321 A | | 1/1996 | Johnson |
| 5,952,865 A | | 9/1999 | Rigazio |
| 6,008,673 A | * | 12/1999 | Glass et al. .................... 327/77 |
| 6,160,421 A | | 12/2000 | Barna |
| 6,232,801 B1 | * | 5/2001 | Khoury et al. ................. 327/57 |
| 6,275,075 B1 | * | 8/2001 | Min ............................. 327/77 |
| 6,320,427 B1 | * | 11/2001 | Shi et al. ....................... 327/77 |
| 6,331,797 B1 | | 12/2001 | Lambert |
| 6,515,532 B2 | | 2/2003 | Jinzai |
| 6,563,362 B2 | | 5/2003 | Lambert |
| 6,617,915 B2 | * | 9/2003 | Rajan .......................... 327/538 |
| 6,680,605 B2 | * | 1/2004 | Chen et al. ................... 323/315 |
| 6,774,698 B1 | | 8/2004 | Bhattacharya et al. |
| 6,891,495 B2 | * | 5/2005 | Chen et al. ................... 341/161 |
| 6,970,022 B1 | * | 11/2005 | Miller .......................... 327/77 |
| 7,005,896 B2 | * | 2/2006 | Chen et al. ................... 327/112 |
| 7,015,736 B1 | * | 3/2006 | Sudjian et al. ............... 327/157 |
| 2005/0146965 A1 | | 7/2005 | Kim et al. |
| 2006/0091951 A1 | | 5/2006 | Abadeer et al. |

OTHER PUBLICATIONS

Hogervorst et. al., "Design of Low-Voltage, Low-Power Operation Amplifier Cells," 1996, pp. 165-167.*

* cited by examiner

*Primary Examiner*—Lincoln Donovan
*Assistant Examiner*—Patrick O'Neill
(74) *Attorney, Agent, or Firm*—William J. Kubida; Scott J. Hawranek; Hogan & Hartson LLP

(57) ABSTRACT

A current comparator includes an input node for receiving an input current, an output node, a first wide swing current mirror having an input coupled to the input node of the current comparator, a power node for receiving a first power supply voltage such as ground, and an output coupled to the output node of the current comparator, and a second wide swing current mirror having an input coupled to the input node of the current comparator, a power node for receiving a second power supply voltage such as VDD, and an output coupled to the output node of the current comparator. The output node can provide either a voltage or current output signal.

15 Claims, 1 Drawing Sheet

US 7,583,108 B2

CURRENT COMPARATOR USING WIDE SWING CURRENT MIRRORS

RELATED CASE INFORMATION

This case is related to my co-pending patent application Ser. No. 11/384,010, entitled "HIGH SPEED VOLTAGE TRANSLATOR CIRCUIT", filed on Mar. 17, 2006.

BACKGROUND OF THE INVENTION

Current comparator circuits, and particularly CMOS current comparator circuits, that have the ability to determine the direction of an input current and to provide a corresponding voltage or current output are known in the art. Current comparators are important building blocks used in the design of many types of analog and mixed analog/digital integrated circuits. Current comparators are widely used, for example, in data converters. While several designs for current comparators are known in the art, the requirements for improved accuracy and speed, and for lower costs imposed by the state of the art provide an ongoing challenge to constantly improve and simplify those existing designs. In many applications the performance of the current comparator circuit is critical in achieving the overall performance goals for the corresponding functional block or integrated circuit. Most simple existing designs are not able to achieve these performance goals if very high speed operation or accuracy is desired. More elaborate designs or processes other than CMOS processes may be used to achieve high speed and accuracy performance goals, but due to circuit complexity or process characteristics they can add unnecessary power dissipation, increased precious integrated circuit die area, and/or additional expense to the finished integrated circuit.

What is desired, therefore, is a high speed current comparator circuit that is able to achieve high bandwidth, excellent common mode range, high gain, and high output resistance, but is realized with a design that can be economically implemented in an integrated circuit.

SUMMARY OF THE INVENTION

According to the present invention a current comparator includes an input node for receiving an input current, an output node, a first wide swing current mirror having an input coupled to the input node of the current comparator, a power node for receiving a first power supply voltage such as ground, and an output coupled to the output node of the current comparator, and a second wide swing current mirror having an input coupled to the input node of the current comparator, a power node for receiving a second power supply voltage such as VDD, and an output coupled to the output node of the current comparator.

The first wide swing current mirror includes a first N-channel transistor having a source for receiving the first power supply voltage, a gate coupled to the input node of the current comparator, and a drain, a second N-channel transistor having a source for receiving the first power supply voltage, a gate coupled to the gate of the first transistor, and a drain, a third N-channel transistor having a source coupled to the drain of the first transistor, a gate coupled to a bias node, and a drain coupled to the input node of the current comparator, and a fourth N-channel transistor having a source coupled to the drain of the second transistor, a gate coupled to the bias node, and a drain coupled to the output node of the current comparator. The bias node is coupled to a source of bias voltage such as one volt, or VDD. If desired, the size of the second and fourth transistors can be made to be a multiple of the size of the first and third transistors.

The second wide swing current mirror includes a first P-channel transistor having a source for receiving the second power supply voltage, a gate coupled to the input node of the current comparator, and a drain, a second P-channel transistor having a source for receiving the second power supply voltage, a gate coupled to the gate of the first transistor, and a drain, a third P-channel transistor having a source coupled to the drain of the first transistor, a gate coupled to a bias node, and a drain coupled to the input node of the current comparator, and a fourth P-channel transistor having a source coupled to the drain of the second transistor, a gate coupled to the bias node, and a drain coupled to the output node of the current comparator. The bias node is coupled to a source of bias voltage such as one volt less than VDD, or ground. If desired, the size of the second and fourth transistors can be made to be a multiple of the size of the first and third transistors.

In operation, the output node of the current comparator of the present invention can be used to provide either an output current indicative of the direction of the input current, or an output voltage indicative of the direction of the input current.

BRIEF DESCRIPTION OF THE DRAWINGS

The aforementioned and other features and objects of the present invention and the manner of attaining them will become more apparent and the invention itself will be best understood by reference to the following description of a preferred embodiment taken in conjunction with the accompanying drawings, wherein.

DETAILED DESCRIPTION

Figure 1:
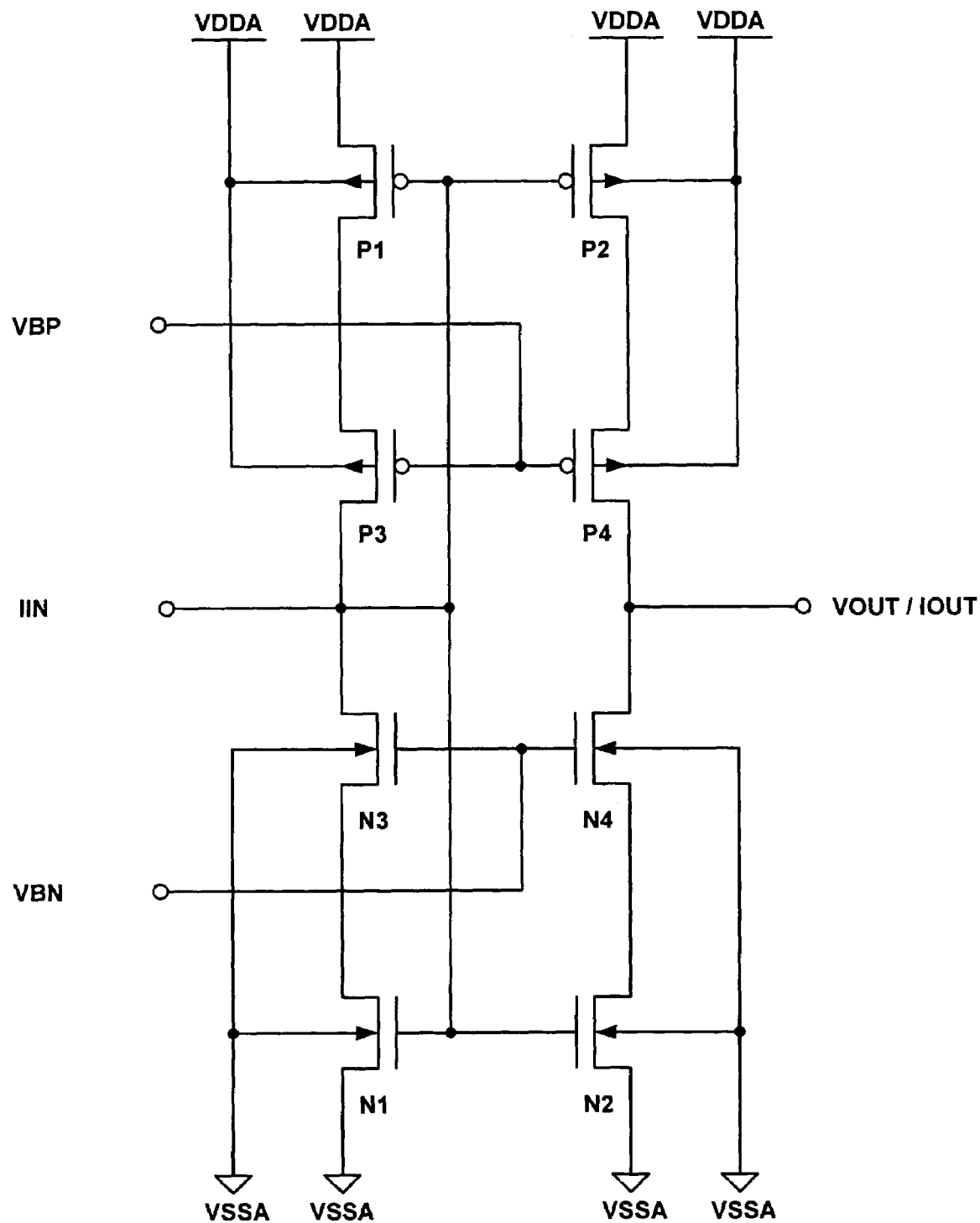
FIG. 1 is schematic diagram of a current comparator according to the present invention including a wide swing N-channel current mirror coupled to a wide swing P-channel current mirror in which the inputs of the two current mirrors are coupled together to an input current node, and the outputs of the two current mirrors are coupled together to an output node.

Referring now to FIG. 1, a detailed schematic diagram of the current comparator 100 of the present invention is shown. The schematic diagram of FIG. 1 includes N-channel transistors N1-N4, as well as P-channel transistors P1-P4. In FIG. 1, VDDA is the positive power, which typically varies between three volts and five volts, and VSSA is the negative power supply, which typically varies between ground and negative two volts. The transistors used is the schematic diagram of FIG. 1 have a gate oxide on the order of about 70-400 Angstroms.

Current comparator 100 includes an input node IIN for receiving a positive or negative input current and an output node VOUT/IOUT (the operation of which is explained in further detail below). A first wide swing current mirror N1-N4 has an input coupled to the input node IIN of the current comparator 100, a power node for receiving a first power supply voltage VSSA such as ground, and an output coupled to the output node of the current comparator VOUT/IOUT. A second wide swing current mirror P1-P4 has an input coupled to the input node IIN of the current comparator, a power node for receiving a second power supply voltage VDDA such as three volts, and an output coupled to the output node VOUT/IOUT of the current comparator 100.

The first wide swing current mirror N1-N4 includes a first N-channel transistor N1 having a source for receiving the first power supply voltage VSSA, a gate coupled to the input node of the current comparator 100, and a drain. A second N-channel transistor N2 has a source for receiving the first power supply voltage VSSA, a gate coupled to the gate of the first transistor N1, and a drain. A third N-channel transistor N3 has a source coupled to the drain of the first transistor N1, a gate coupled to a bias node VBN, and a drain coupled to the input node IIN of the current comparator 100. A fourth N-channel transistor N4 has a source coupled to the drain of the second transistor N2, a gate coupled to the bias node VBN, and a drain coupled to the output node of the current comparator VOUT/IOUT. The bias node VBN is coupled to a source of bias voltage such as one volt, or VDDA, or other suitable bias voltage. If desired, the size of the second and fourth transistors can be made to be a multiple of the size of the first and third transistors. This will impact the level of the output current, which is explained in further detail below.

The second wide swing current mirror P1-P4 includes a first P-channel transistor P1 having a source for receiving the second power supply voltage VDDA, a gate coupled to the input node of the current comparator IIN, and a drain. A second P-channel transistor P2 has a source for receiving the second power supply voltage VDDA, a gate coupled to the gate of the first transistor P1, and a drain. A third P-channel transistor has a source coupled to the drain of the first transistor P1, a gate coupled to a bias node VBP, and a drain coupled to the input node of the current comparator IIN. A fourth P-channel transistor P4 has a source coupled to the drain of the second transistor P2, a gate coupled to the bias node VBP, and a drain coupled to the output node of the current comparator VOUT/IOUT. The bias node VBP is coupled to a source of bias voltage such as one volt less than VDDA, or ground, or other suitable bias voltage. If desired, the size of the second and fourth transistors can be made to be a multiple of the size of the first and third transistors. This will also impact the level of the output current, which is explained in further detail below.

In operation, the output node VOUT/IOUT of the current comparator 100 of the present invention can be used to provide either an output current indicative of the direction of the input current, or an output voltage indicative of the direction of the input current.

The following description is related to the use of the output terminal VOUT/IOUT for providing an output current. A positive input current flows into the first wide swing current mirror at the drain of transistor N3. The output current flows into the first wide swing current mirror at the drain of transistor N4. Alternatively, a negative input current flows out of the second wide swing current mirror at the drain of transistor P3. The output current flows out of the second wide swing current mirror at the drain of transistor N4. If transistors N1-N4 and P1-P4 have the same size, then the input and output currents will have the same magnitude. If the size of transistors N4 and N2 are made a multiple of the size of transistors N1 and N3, and if the size of transistors P2 and P4 are made the same multiple of the size of transistors P1 and P4, then the magnitude of the output current will be that multiple of the input current. For example, if the size of transistors N2 and N4 and P2 and P4 are made a factor of four times the size of transistors N1 and N3 and P1 and P3, and the input current is 1 μA, then the output current will be 4 μA.

In the example of FIG. 1, the following n-channel transistor sizes are provided:

N1 5 μm×1 μm
N2 5 μm×1 μm
N3 10 μm×1 μm
N4 10 μm×1 μm

In the example of FIG. 1, the following p-channel transistor sizes are provided:

P1 10 μm×1 μm
P2 10 μm×1 μm
P3 10 μm×1 μm
P4 10 μm×1 μm

The following description pertains to using the VOUT/IOUT node as a voltage output. If a voltage output is used, the output node swings substantially between the VDDA and VSSA power supply voltages. A positive input current provides a VSSA level output voltage, and a negative input current provides a VDDA level output voltage.

In the example of FIG. 1, the body connection for the N-channel transistors is coupled to VSSA, whereas the body connection for the P-channel transistors is coupled to VDDA.

With a typical CMOS process, the performance of the current comparator of the present invention is markedly improved with respect to other known prior art current comparators, such as the one shown in my co-pending patent application Ser. No. 11/384,010, entitled "HIGH SPEED VOLTAGE TRANSLATOR CIRCUIT", filed on Mar. 17, 2006. The current comparator of the present invention has the following specifications:

| High Bandwidth | 70 MHz |
| Reduced Input Impedance | 500 Ω |
| Increased Output Resistance | $10^{12}$ Ω |
| Increased Gain | $2 \times 10^9$ |

The input resistance is determined by the inverse of the sums of the gms of transistors P1 and N1, which is about $1/(2 \times 10^{-3})$ or about 500Ω. The output resistance is determined by paralleling the output resistances of the first and second current mirrors. The output resistance of the first current mirror is given by:

$$ROUT1 = gm_{N4}/(gds_{N4} \times gds_{N2}) \qquad [1]$$

The output resistance of the second current mirror is given by:

$$ROUT2 = gm_{P4}/(gds_{P4} \times gds_{P2}) \qquad [2]$$

Since the value of gm is about $10^{-3}$ and the value of gds is about $10^{-6}$, the parallel combination of ROUT1 and ROUT2 is about $10^{12}$Ω.

The current comparator of the present invention has excellent switching response over a wide range of process conditions and operating voltages, excellent common mode rejection, and has virtually no output offset with respect to input current.

While there have been described above the principles of the present invention in conjunction with specific memory architectures and methods of operation, it is to be clearly understood that the foregoing description is made only by way of example and not as a limitation to the scope of the invention. Particularly, it is recognized that the teachings of the foregoing disclosure will suggest other modifications to those persons skilled in the relevant art. Such modifications may involve other features which are already known per se and which may be used instead of or in addition to features already described herein. Although claims have been formulated in this application to particular combinations of features, it should be understood that the scope of the disclosure herein also includes any novel feature or any novel combination of features disclosed either explicitly or implicitly or any generalization or modification thereof which would be apparent to persons skilled in the relevant art, whether or not such relates to the same invention as presently claimed in any claim and whether or not it mitigates any or all of the same technical problems as confronted by the present invention. The applicants hereby reserve the right to formulate new claims to such features and/or combinations of such features during the prosecution of the present application or of any further application derived therefrom.

We claim:

1. A current comparator, comprising:
   an input node for receiving an input current;
   an output node;
   a first wide swing current mirror comprising:
      an input coupled to the input node of the current comparator, a power node for receiving a first power supply voltage, and an output coupled to the output node of the current comparator, wherein the first wide swing current mirror comprises a first N-channel transistor directly coupled to the first power supply voltage, a gate directly coupled to the input node of the current comparator, and a drain;
      a second N-channel transistor directly coupled to the first power supply voltage, a gate coupled to the gate of the first N-channel transistor, and a drain;
      a third N-channel transistor having a source directly coupled to the drain of the first N-channel transistor, a gate coupled to a bias node, and a drain coupled to the input node of the current comparator;
      a fourth N-channel transistor having a source directly coupled to the drain of the second N-channel transistor, a gate coupled to the bias node, and a drain coupled to the output node of the current comparator; and
   a second wide swing current mirror formed using P-channel transistors comprising an input coupled to the input node of the current comparator, a power node for receiving a second power supply voltage, and an output coupled to the output node of the current comparator.

2. The current comparator of claim 1, wherein the first power supply voltage comprises ground.

3. The current comparator of claim 1, wherein the bias node is coupled to a source of bias voltage.

4. The current comparator of claim 3, wherein the bias voltage is substantially equal to one volt.

5. The current comparator of claim 3, wherein the bias voltage is substantially equal to VDD.

6. The current comparator of claim 1, wherein the size of the second and fourth transistors is a multiple of the size of the first and third transistors.

7. The current comparator of claim 1, wherein the second wide swing current mirror comprises:
   a first transistor having a source directly coupled to the second power supply voltage, a gate coupled to the input node of the current comparator, and a drain;
   a second transistor having a source directly coupled to the second power supply voltage, a gate coupled to the gate of the first transistor, and a drain;
   a third transistor having a source coupled to the drain of the first transistor, a gate coupled to a bias node, and a drain coupled to the input node of the current comparator; and
   a fourth transistor having a source coupled to the drain of the second transistor, a gate coupled to the bias node, and a drain coupled to the output node of the current comparator.

8. The current comparator of claim 7, wherein the second power supply voltage comprises VDD.

9. The current comparator of claim 7, wherein the bias node of the second wide swing current mirror is coupled to a source of bias voltage.

10. The current comparator of claim 9 wherein the bias voltage of the second wide swing current mirror is substantially equal to one volt less than VDD.

11. The current comparator of claim 9 wherein the bias voltage of the second wide swing current mirror is substantially equal to ground.

12. The current comparator of claim 7 wherein the size of the second and fourth transistors of the second wide swing current mirror is a multiple of the size of the first and third transistors of the second wide swing current mirror.

13. A current comparison method, comprising:
    providing a first wide swing current mirror comprising:
       an input coupled to an input node of a current comparator, a power node for receiving a first power supply voltage, and an output coupled to an output node of the current comparator, wherein the first wide swing current mirror comprises a first N-channel transistor having a source directly coupled to the first power supply voltage, a gate directly coupled to the input node of the current comparator, and a drain;
       a second N-channel transistor having a source directly coupled to the first power supply voltage, a gate coupled to the gate of the first N-channel transistor, and a drain;
       a third N-channel transistor having a source directly coupled to the drain of the first N-channel transistor, a gate coupled to a bias node, and a drain coupled to the input node of the current comparator;
       a fourth N-channel transistor having a source coupled to the drain of the second N-channel transistor, a gate coupled to the bias node, and a drain coupled to the output node of the current comparator; and
    providing a second wide swing current mirror formed using P-channel transistors comprising an input coupled to the input node of the current comparator, a power node for receiving a second power supply voltage, and an output coupled to the output node of the current comparator.

14. The current comparison method of claim 13 further comprising using the output node to provide an output current indicative of the direction of the input current.

15. The current comparison method of claim 13 further comprising using the output node to provide an output voltage indicative of the direction of the input current.

* * * * *